United States Patent [19]

Yamamoto et al.

[11] 4,207,479
[45] Jun. 10, 1980

[54] TOUCH SENSITIVE SWITCH ARRANGEMENT WITH AN I²L STRUCTURE

[75] Inventors: Keizo Yamamoto, Nara, Japan; Charles C. Austin, Huntington Beach, Calif.

[73] Assignees: Sharp Kabushiki Kaisha, Osaka, Japan; Hycom Incorporated, Irvine, Calif.

[21] Appl. No.: 809,892

[22] Filed: Jun. 24, 1977
(Under 37 CFR 1.47)

[30] Foreign Application Priority Data

Jun. 24, 1976 [JP] Japan .................. 51-75038

[51] Int. Cl.² .............. H03K 17/00; H03K 3/26
[52] U.S. Cl. .................. 307/308; 307/315; 307/299 B; 368/224
[58] Field of Search ............ 307/315, 308, 299 B; 328/5; 331/65; 340/258; 200/D1; 58/23 A; 357/92

[56] References Cited
U.S. PATENT DOCUMENTS

| | | | |
|---|---|---|---|
| 3,862,432 | 1/1975 | Larson | 307/315 |
| 3,944,843 | 3/1976 | Vaz Martins | 328/5 |
| 3,986,199 | 10/1976 | Williams | 58/23 A |
| 3,992,634 | 11/1976 | Larson | 307/308 |
| 4,048,796 | 9/1977 | Sasaki | 58/23 A |

OTHER PUBLICATIONS

Choosing sides in Digital Watch Technology Electronics, 6/10/76, pp. 91-99.

*Primary Examiner*—Stanley D. Miller, Jr.
*Assistant Examiner*—B. P. Davis
*Attorney, Agent, or Firm*—Birch, Stewart, Kolasch and Birch

[57] ABSTRACT

A touch sensitive switch arrangement with an I²L (Integrated Injection Logic) structure includes a battery power source, a current limiter, an injector, a first-stage and second-stage switching transistors being both supplied with current from the injector, a first touch electrode connected to the positive polarity of the battery power source and a second touch electrode connected to the base of the first-stage switching transistor with electrical isolation from the first touch electrode.

12 Claims, 5 Drawing Figures

TOUCH SENSITIVE SWITCH ARRANGEMENT WITH AN I²L STRUCTURE

BACKGROUND OF THE INVENTION

The present invention pertains to a touch sensitive switch arrangement having an I²L structure which is useful with battery-powered electronic apparatus such as electronic wristwatches.

Operation of electronic apparatus is taken out in various modes. One way is a touch sensitive switch which employs the human body as a means of electrical conduction and thus delivers either an ON or OFF signal depending upon whether two touch electrodes are bridged via the human body.

Employment of this type of the touch switch is limited on battery powered apparatus and not on commercial power utilizing apparatus. This is due to the fact that perfect assurance is not expected of electrical insulation between a primary winding and a secondary winding of a power transformer and it is not possible to avoid an electrical danger of the human body in case of the commercial power utilizing apparatus. However, in case of the battery-powered apparatus limits are usually placed on the capacity of the battery and thus this needs a considerable reduction in power consumption. To this end C-MOS transistors are very often employed in the design of circuit construction of the battery-powered apparatus. In addition, there has been proposed touch switches similarly comprised of C-MOS transistors.

More recently, attention has been directed to a low voltage operating and low power consuming I²L (Integrated Injection Logic) circuit. With such an I²L structure resistors of large area are eliminated and only four masks are needed in manufacturing because of its simplified gate structure. Moreover, it does not have any adverse effect on other bipolar elements incorporated within the same wafer.

Accordingly, it is an object of the present invention to provide a touch sensitive switch arrangement which is inexpensive and suited for large-scale production and more particularly implemented with I²L circuit technology.

The following are the requirements needed to operate a touch sensitive switch circuit successfully.

First of all, a range of resistance values of the human body enabling switching functions normally extends 10KΩ through 10MΩ. This is dependent mainly upon personal differences, differences in contact positions with the human body and environmental factors such as temperature and humidity. It is, therefore, necessary to determine for all the resistances values whether the touch sensitive switch circuit is bridged by the human body. The touch sensitive circuit from fulfill the following requirements:

1. It shall not operate inadvertently even when receiving induced voltage (hum) from a commercial power source so forth.
2. Circuit damage shall be caused upon receipt of static electricity on the order of several thousand through twenty or thirty thousand volts.
3. It shall have response characteristics which will not degrade operating facility.
4. An operation range shall withstand differences in various factors of used components.
5. Switching voltage and switching current will not vary with accompanying a wider range of switching operation.

In accordance with the teachings of the present invention, there is provided an improved touch sensitive switch arrangement suited for I²L implementations. This includes a battery power source, a current limiter, an injector and a first-stage and second-stage switching transistors being supplied with current from the injector. A first touch electrode is connected to the positive polarity of the battery power source while a second touch electrode is connected to an input terminal of an I²L circuit. The first-stage switching transistor within the I²L circuit structure is normally OFF to minimize power consumption. An operation range of the I²L circuit is not limited by utilizing the above-mentioned connections.

BRIEF DESCRIPTION OF THE INVENTION

A better understanding of the invention may be had from a consideration of the following detailed description taken in conjunction with the accompanying drawings in which.

DETAILED DESCRIPTION OF THE INVENTION

Figure 1:
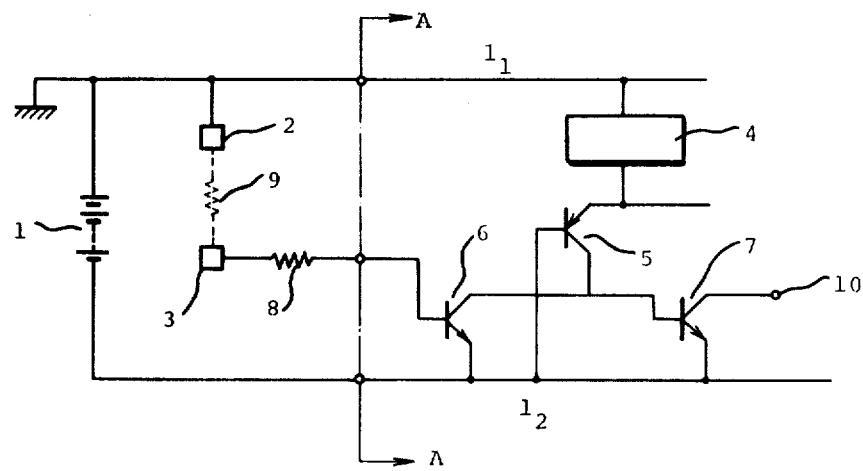
FIG. 1 is a circuit diagram showing one preferred form of the present invention.

Referring now to FIG. 1, there is illustrated a basic circuit embodying the present invention, which includes a battery power source 1, a first touch electrode 2 connected to a positive potential power line $1_1$, a second touch electrode 3 provided with electrical isolation from the first touch electrode 2, a current limiter 4 implemented with I²L technology, and a so-called injector (a base-grounded PNP transistor serving as a source of constant current). The current limiter 4 supplies the injector 5 with current large enough to enable I²L operation with low power consumption. The collector of the injector 5 is connected to the collector of a first-stage NPN switching transistor 6 and the base of a second-stage NPN switching transistor. The base of the first-stage transistor 6 is connected to the second touch electrode 2 via a current limiting resistor 8.

In FIG. 1, the portion of the circuit arrangement defined by the line A—A as containing the current limiter 4, the injector 5, and the switching transistors 6 and 7 establishes the I²L circuit. A negative potential power line is denoted as $1_2$. The base of the first-stage switching transistor is an input terminal of the I²L circuit. The resistance of the human body which will be connected between the touch electrodes 2 and 3 is indicated at 9.

If a circuit between the touch electrodes 2 and 3 is in the opened state, the first-stage switching transistor 6 is OFF so that current from the injector 5 is supplied to the base of the next-stage switching transistor 7 thereby to render the same ON. When the human body resistance 9 is interposed between the touch electrodes 2 and 3, a high potential is impressed on the base of the first-stage switching transistor 6 via the human body resistance 9 and the current limiting resistor 8 to turn ON the same. The first-stage switching transistor 6 being in the ON state permits current from the injector 5 to flow into the first-stage switching transistor 6 but not the next-stage switching transistor 7. As a result, the next-stage switching transistor 7 is turned OFF. In this manner, ON and OFF switching signals are developed at the collector terminal 10 of the next-stage switching transistor 7 in accordance with the presence or absence of the human body resistance 9 connected between the touch electrodes 2 and 3. These switching signals are supplied to a succeeding utilization circuit, although not shown. However, the circuit example shown in FIG. 1 shall undergo the following disadvantages. Firstly, there is a possibility that if noise such as power source hum is induced onto the touch electrode 3 in the opened state then operation will be inadvertently performed because a high potential is applied directly to the base of the first-stage switching transistor 6 via the current limiting resistor 8. In addition, the first-stage switching transistor 6 is of the emitter grounded type so that current gain is largely varied and an operating range is much limited. Therefore, this implies that high current gain transistors are very sensitive to a small amount of noise. A noise margin at the negative potential side is smaller than that at the positive potential side because the base-to-emitter voltage of only a single switching transistor 6 is utilized as switching voltage. In the event that high voltage such as static electricity is induced onto the touch electrode 2 or 3, this will result in voltage breakdown in the I$^2$L circuit denoted by the line A—A.

Figure 2:
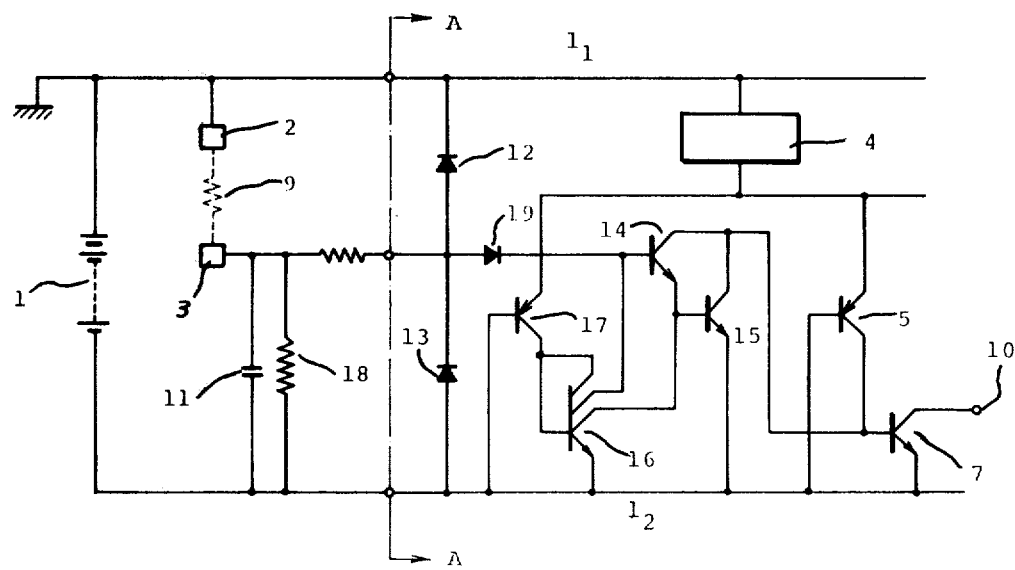
FIG. 2 is a circuit diagram showing another preferred form of the present invention.

FIG. 2 illustrates a preferred form of the invention which overcomes the above-listed shortcoming, wherein respective components denoted by the same reference minerals as in FIG. 1 function in the same way as in FIG. 1.

In more detail, so as to remove the influences of power source hum, etc., a capacitor 11 is connected between the touch electrode 3 and the negative potential power source line 1$_2$, thereby eliminating alternating current components of noise. As an alternate, the capacitor 11 may be connected behind the current limiting resistor 8. Protective means against static electricity is provided by respectively connecting diodes 12 and 13 in the backward direction between the input terminal of the I$^2$L circuit and the positive potential source line 1$_1$ and the negative potential source line 1$_2$.

Darlington connected transistors 14 and 15 used instead of of the first-stage switching transistor 6 of FIG. 1 serve to shift switching voltage to the positive potential side. Switching voltage with respect to both of the positive and negative potential lines 1$_1$ and 1$_2$ is incremented by keeping a balance. Thus, a good noise margin is assured. Variations in current amplification factor are reduced by connecting an additional load of substantially fixed impedance to the input terminal of the I$^2$L circuit. In other words, that load is established by a current mirror circuit, which comprises a feed-back type multi-collector transistor 16 having a collector connected to the bases of the respective transistors 14 and 15 and a second collector connected to its base, and a base-grounded PNP transistor (injector) 17 serving as a source of constant current for the multi-collector transistor 16.

The injector 17 supplies amplitude-controlled current from the current limiter 4 to the multi-collector transistor 16. Because one of the collectors of the multi-collector transistor 16 is connected back to its base, the same amount of current as that from the injector 17 flows through the other collector. Accordingly, when the Darlington connected transistor 15 is in the ON state, only the amount of current restricted by the multi-collector transistor 16 will flow through the bases of the Darlington arrangement. Variations in current amplification factor are substantially negligible.

In this way, the circuit example of FIG. 2 alleviates various influences of the operation margin, the noise margin and variations in the used components such as capacitors and resistors.

While charge is accumulated on the capacitor 11 during a period of time where the human body 9 is interposed between the touch electrodes 2 and 3, no discharge path is developed when the circuit between the touch electrodes 2 and 3 is opened. This results in very poor response characteristics at the trailing edges. In this instance, the accumulated charge is permitted to discharge only through the first-stage switching transistors 14 and 15. It takes a lot of time to discharge since these transistors 14 and 15 are light-loads which are required to enable switching when current is being supplied via the human body resistance 9. A resistor 18 connected in parallel with the capacitor 11 can provide a solution of such problem and therefore permit charge accumulated on the capacitor 11 to discharge therethrough at the trailing edge thereby improving the response characteristics. Advantageously, when the circuit between the touch electrodes 2 and 3 is opened the resistor 18 forces the one touch electrode 3 into the negative potential side to enlarge a noise margin.

It is recommended that the capacitor 11 and the resistor 18 be connected behind the current limiting resistor 8. This is because the breakdown voltage of the capacitor 11 can be lowered due to the current limiting resistor 8 and thus the capacitor 11 is widely selectable without damage therein.

A diode 19 inserted between the input terminal of the I$^2$L circuit and the base of the transistor 14 is to direct further switching voltage toward the positive potential side and hence to help the function of the Darlington connected transistors 14 and 15.

Figure 3:
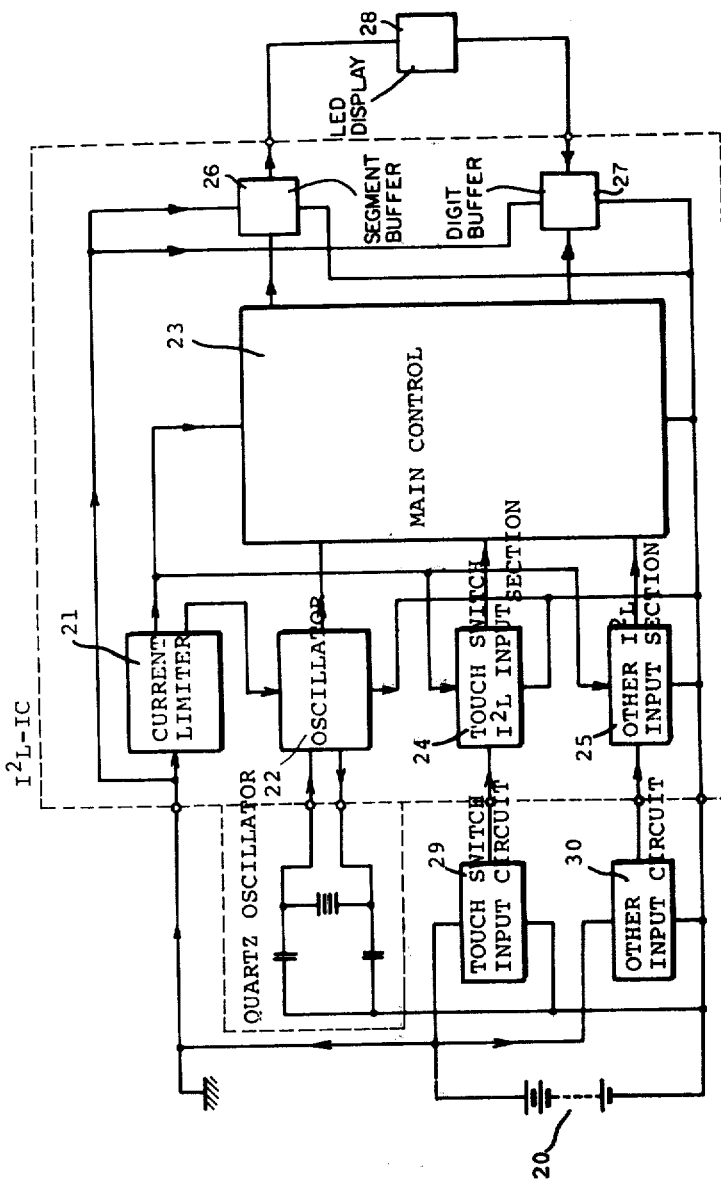
FIG. 3 is a block diagram showing an example of application of the present invention.

FIG. 3 is a block diagram showing an example of application of the above-discussed touch switch arrangement to an LED (light emitting diode) display type solid state wristwatch.

A current controller 21 restricts current supply from a battery power source 20 to a necessary amount for a quartz oscillator 22 and to a necessary amount for a main control 23, a touch switch I$^2$L input section 24 and an other switch I$^2$L input section 25. These amounts of current are supplied to an injector (not shown) within the I$^2$L structure to perform low power consumption operation. Meantime, a segment buffer 26 and a digit buffer 27 need a large amount of current. They are operable only when activating an LED display 28. Therefore, these buffers are implemented with a bipolar IC and supplied with current directly from the battery power source 20 and not via the current limiter 21. As is well known in the art of electronic wristwatches, a main control 23 has the function of frequency dividing a time standard derived from the quartz oscillator 22 for timekeeping purposes, the function of decoding timekeeping signals into the segment buffer 26 and the digit buffer 27, the function of controlling the LED display 28, the function of enabling time adjustment, etc. Operation of the other switch input section 29 together with operation of the touch switch input section 30 enables proper functions within the main control 23 via the touch switch I²L input section 24 and the other switch I²L input section 25. A portion of the current controller 21 and the touch switch input section 29 and the touch switch I²L input section 24 are identical with the examples illustrated in FIGS. 1 and 2.

With respect to FIGS. 1 and 2, it is better that the touch electrode 2 is set up by a metallic watch casing connected to the positive polarity or anode of the battery power source 1 while the second touch electrode 3 is set up by a metallic vessel supporting a front glass sheet with electrical isolation from the watch casing or by an electrically conductive front glass sheet isolated from the watch casing.

Figure 4:
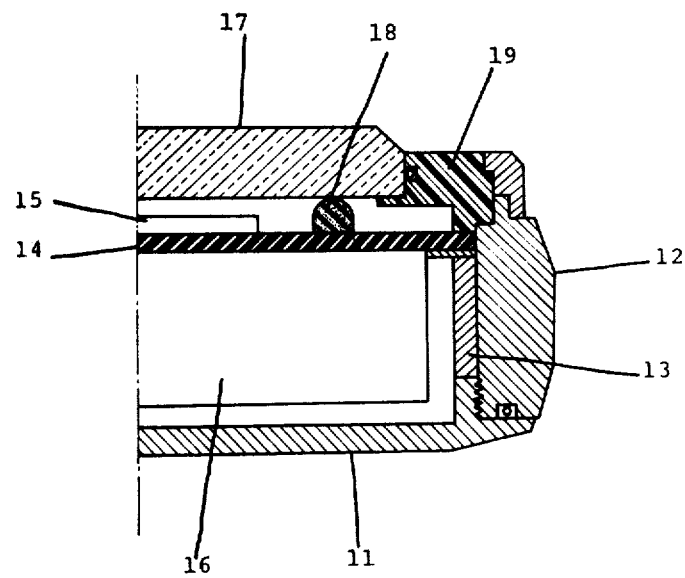
FIG. 4 is a detailed cross-sectional view of the application illustrated in FIG. 3.

FIG. 4 illustrates a cross-sectional view of the wristwatch embodying the present invention.

The illustrated example includes an electrically conductive front glass sheet 31, a metallic watch casing 32 inclusive of a rear lid, an insulating support 33 interposed between the front glass sheet 31 and the watch casing 32 and made of plastic material. A circuit board 34 carries an LED display 35 on the upper surface and other circuit elements 36 on the rear surface. An electrically conductive connector 37 provides connections between the front glass sheet 31 and the electronics portion 36 through patterned conductors and throughholes (not shown) of the circuit board 34. Electrical connections between the watch casing 32 and the electronics portion 36 are provided directly or via a metallic cavity placed into contact with pattern conductors deposited on the rear of the circuit board 34 and led from the electronics portion 36. In this example, the front glass sheet 31 corresponds to the second touch electrode 3 of FIGS. 1 and 2 and the watch casing 32 corresponds to the first touch electrode 2.

Figure 5:
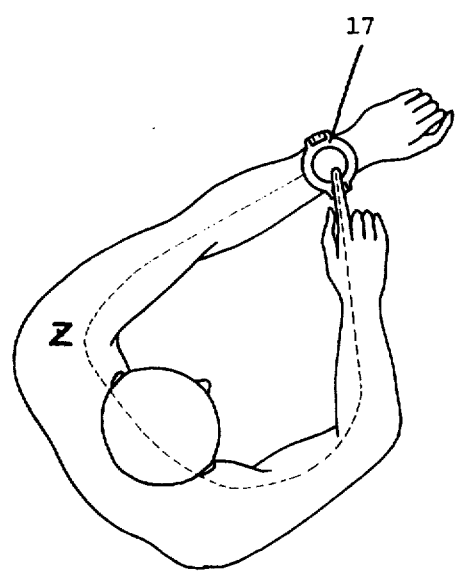
FIG. 5 is a perspective view showing an operational mode of the invention illustrated in FIG. 3.

The wristwatch is worn on a user's wrist as shown in FIG. 5. If the user touches the front glass sheet 31 by his finger 40, a current loop 41 as denoted by the dotted line will be established between the front glass sheet 31 and the watch casing 32. In conclusion, the human body resistance 9 is connected between the first touch electrode 2 and the second touch electrode 3 (see FIGS. 1 and 2).

Thus, the LED display wristwatch embodying the present invention enjoys the benefits.

1. Power consumption is very small as in case of C-MOS implementations.

2. Enabling voltage is relatively low (about 0.7 volts) and thus preferable for battery-powered apparatus.

3. Highly-integrated IC's can be manufactured through the use of only four masks.

4. Conventional bipolar manufacturing processes are applicable. Therefore, a digital circuit region with the I²L structure and an analog circuit region with the conventional bipolar structure can be implemented on the same chip at one time.

5. For the buffer stages requiring a large amount of current to drive the LED display, bipolar transistors are much better than MOS transistors since bipolar transistors with 1/100 area are given the same driving power as compared with MOS transistors. This is because emitters, bases and collectors of bipolar transistors are deeply diffused and formed while sources, gates and drains of MOS transistors are formed in the substantially same plane. This feature is fruitful for LED display electronic wristwatch.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A touch sensitive switch comprising:
   a battery power source means having positive and negative terminals;
   a current limiter means connected to said positive terminal of said battery power source means;
   a first injector means driven by said current limiter means for providing a constant current output;
   Darlington connected first-stage and second-stage switching transistor means having base and emitter regions, said transistor means being supplied with current from the injector means, the emitter region of said Darlington connected second stage switching transistor means being connected to said negative terminal of said battery power source means;
   a current mirror circuit means energizing said Darlington connected first-stage switching transistor and comprised of a second injector means and a multi-collector transistor means, said mirror circuit connected to said negative terminal of said battery power source means;
   a first touch electrode connected to the positive terminal of the battery power source means; and
   a second touch electrode connected to the base of the Darlington connected first-stage switching transistor means said second touch electrode maintaining electrical isolation from the first touch electrode.

2. The touch sensitive switch as defined in claim 1 further comprising a noise reduction capacitor means connected to the negative terminal of the battery power source means for protecting against interference with alternating components of noise.

3. The touch sensitive switch as defined in claim 2 wherein the noise reduction capacitor means is connected in parallel with a resistor means.

4. The touch sensitive switch as defined in claim 3 wherein said base of said Darlington connected first-stage switching transistor means is protected by a pair of diodes connected in the backward direction across the input terminal of said Darlington connected first stage switching transistor means and to the positive terminal and the negative terminal of the battery power source means.

5. The touch sensitive switch as defined in claim 1 wherein said second touch electrode and said base of said Darlington connected first-stage switching transistor are protected by a diode, saide diode being connected in the forward direction between said electrode and said base.

6. A touch-sensitive switching circuit having a predetermined current amplification factor and first and second switching states comprising:
   a battery power source means for providing a source of electrical current;
   a first and second touch electrode means adapted to be bridged by a resistance inherent to a human body portion, said first touch electrode means being connected to one terminal of said battery power source means;
   a current limiter means responsive to said battery power source means for limiting said source of electrical current from said battery power source means thereby providing a predetermined quantity of electrical current, said predetermined quantity being large enough to enable said touch sensitive switching circuit;

an injector means responsive to said predetermined quantity of electrical current from said current limiter means for providing a source of constant current; and switching transistor means, responsive to said injector means and the interposition of said resistance between said first and second touch electrode means for switching from a first switched stated to a second switched state in response to the interposition of said human body resistance between said first and second touch electrode means and to the flow of constant current from said injector means, and for switching from said second switched state to said first switched state in response to removal of said resistance from said touch electrode means and to the flow of constant current from said injector means.

7. A touch sensitive switching circuit in accordance with claim 6, wherein said switching transistor means comprises:

a first stage transistor means interconnected with said second touch electrode means on one side and with said injector means on the other, said first stage transistor means and said injector means forming a junction; and a second stage transistor means interconnected with said junction on one side and forming an output termination on the other, said first-stage transistor means being in said first switched state and said second stage transistor means being in said second switched state when said resistance is interposed between said touch electrode means;

said first stage transistor means being in said second switched state and said second stage transistor means being in said first switched state when said resistance is removed from said touch electrode means.

8. A touch sensitive switching circuit in accordance with claim 7, wherein said injector means comprises a base grounded PNP transistor means having an emitter and a collector, said emitter of said PNP transistor means being connected to said junction, said collector of said PNP transistor means being connected to said current limiter means.

9. A touch-sensitive switching circuit in accordance with claim 7, wherein said first stage transistor means further comprises:

a Darlington connected first and second transistor means, the emitter of said first transistor means being connected to the base of said second transistor means.

10. A touch-sensitive switching circuit in accordance with claim 9, wherein said touch sensitive switching circuit further comprises:

a current mirror circuit means connected to said Darlington connected first and second transistor means for reducing the variation in said current amplification factor associated with said touch sensitive switching circuit thereby minimizing the power consumption of said switching circuit, said current mirror circuit means comprising an injector means connected to the base of a multi-collector transistor means.

11. A touch-sensitive switching circuit in accordance with claim 6, wherein said touch-sensitive switching circuit further comprises: protecting means, connected to the input terminals of said integrated injection logic circuit means, for protecting said integrated injection logic circuit means against interference with static electricity and noise.

12. A touch-sensitive switching circuit in accordance with claim 11, wherein said protecting means comprises:

diode means, connected to the input terminals of said integrated injection logic circuit means for protecting against interference with static electricity; and capacitor means, connected across said diode means, for protecting against interference with an alternating component of noise.

* * * * *